(12) United States Patent
Stelzl et al.

(10) Patent No.: US 7,673,386 B2
(45) Date of Patent: Mar. 9, 2010

(54) FLIP-CHIP COMPONENT PRODUCTION METHOD

(75) Inventors: Alois Stelzl, Munich (DE); Christian Bauer, Munich (DE); Hans Krueger, Munich (DE); Robert Hammedinger, Poing (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/277,927

(22) Filed: Nov. 25, 2008

(65) Prior Publication Data

US 2009/0071710 A1 Mar. 19, 2009

Related U.S. Application Data

(63) Continuation of application No. PCT/DE2007/000970, filed on May 30, 2007.

(30) Foreign Application Priority Data

May 30, 2006 (DE) .................. 10 2006 025 162

(51) Int. Cl.
*H05K 3/34* (2006.01)
*H01L 23/02* (2006.01)
(52) U.S. Cl. .............. 29/840; 29/832; 29/846; 257/685; 257/686
(58) Field of Classification Search .............. 29/832, 29/833, 840, 846; 257/685, 686
See application file for complete search history.

(56) References Cited

U.S. PATENT DOCUMENTS 4,748,495 A * 5/1988 Kucharek ............ 257/713
4,788,767 A * 12/1988 Desai et al. ............ 29/830
5,186,383 A 2/1993 Melton et al.
5,448,114 A 9/1995 Kondoh et al.
5,828,063 A * 10/1998 Koster et al. ............ 250/288
6,171,887 B1 1/2001 Yamaji
6,722,030 B1 4/2004 Stelzl et al.
6,982,380 B2 1/2006 Hoffmann et al.
7,388,281 B2 6/2008 Krueger et al.
7,545,029 B2 * 6/2009 Wilson et al. ........... 257/685
2004/0104460 A1 6/2004 Stark
2008/0042250 A1 * 2/2008 Wilson et al. ........... 257/686

FOREIGN PATENT DOCUMENTS

| DE | 43 23 799 A1 | 1/1994 |
| DE | 198 06 818 C1 | 11/1999 |
| DE | 102 38 523 A1 | 3/2004 |
| EP | 0 896 427 A2 | 2/1999 |
| WO | WO 2005/001934 A2 | 1/2005 |

OTHER PUBLICATIONS

Kloeser, J., "Copper Pillar," Mikromontage, May 2006, pp. 81-83.

* cited by examiner

*Primary Examiner*—C. J Arbes
(74) *Attorney, Agent, or Firm*—Slater & Matsil, L.L.P.

(57) ABSTRACT

The electrical and mechanical connection between a component chip and a carrier substrate having electrical wiring is realized by means of bumps. A support frame that is adapted in its height to the height of the bumps is arranged between the carrier substrate and the component chip and has a planar or planarized surface, so that it contacts closely to the bottom side of the component chip. Different covers are proposed for the additional encapsulation.

22 Claims, 9 Drawing Sheets

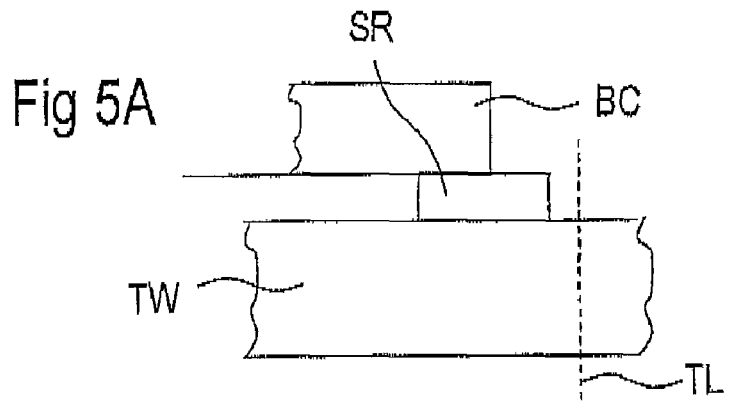
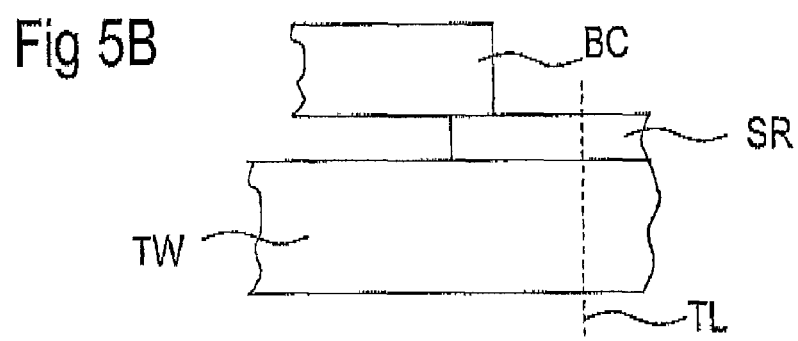
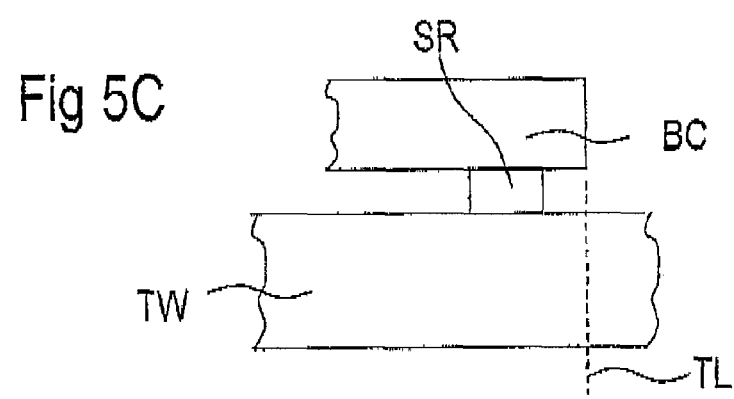
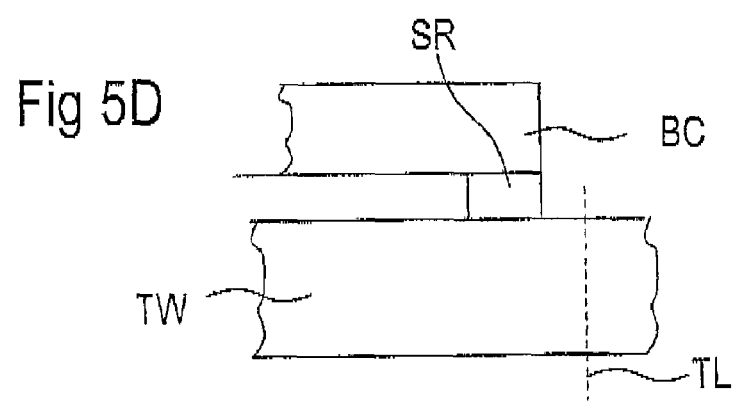

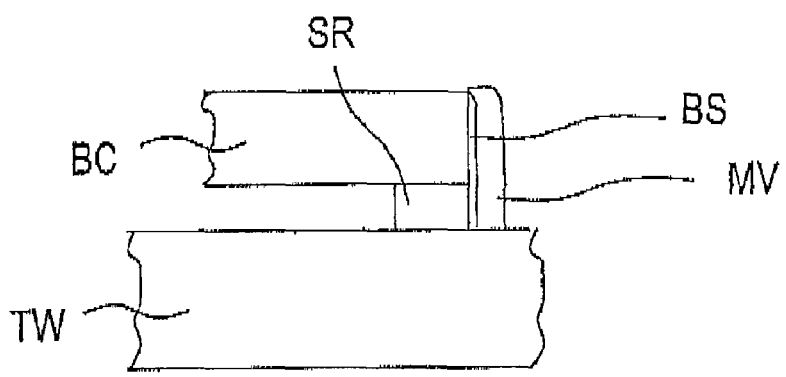
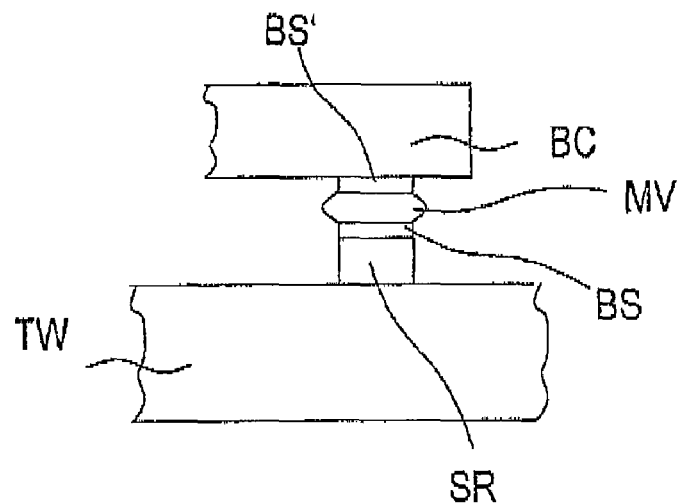
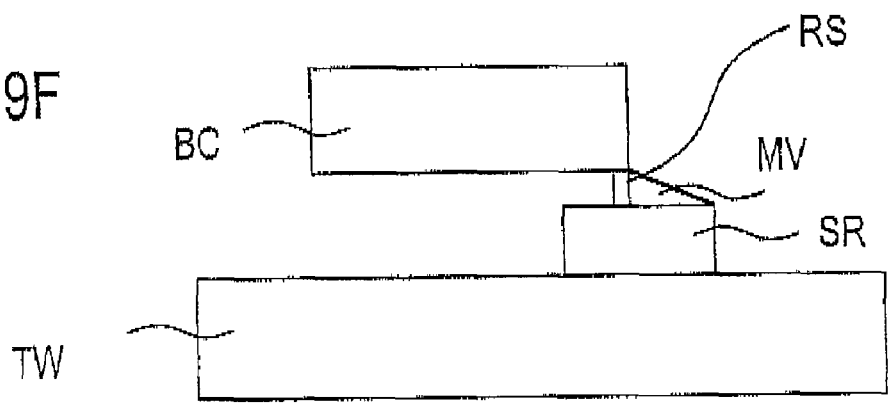

FLIP-CHIP COMPONENT PRODUCTION METHOD

This application is a continuation of co-pending International Application No. PCT/DE2007/000970, filed May 30, 2007, which designated the United States and was not published in English, and which claims priority to German Application No. 10 2006 025 162.8 filed May 30, 2006, both of which applications are incorporated herein by reference.

TECHNICAL FIELD

The invention relates to a component that comprises a component chip mounted on a carrier substrate using flip-chip technology and to a method for its production.

BACKGROUND

For such components, a component encapsulation is known from U.S. Pat. No. 6,982,380 B1 in which a component chip carrying the component structures is mounted using flip-chip technology with the help of bump connections on a carrier substrate in which the component chip is arranged above the carrier substrate at a distance to this substrate. Here, a frame is arranged between the component chip and carrier substrate, wherein this frame lies on the surfaces of the component chip and carrier substrate or leaves a narrow gap and thus forms a hollow space holding the component structures. The hollow space is sealed from the outside by a sealing material, in particular, a combination of metal layers.

SUMMARY

In various aspects, the present invention specifies a component that is easy to produce and can be reliably sealed from the outside world.

An electrical component is proposed that includes a component chip mounted on a single-layer or multi-layer carrier substrate using flip-chip technology. The electrical and mechanical connection between the component chip and the carrier substrate having electrical wiring is realized by means of bumps. Between the carrier substrate and the component chip, a support frame is arranged that is adapted, in its height, to the height of the bumps and has a planar, in particular, planarized and, e.g., planar polished surface, so that it contacts tightly to the bottom side of the component chip.

Such a component is distinguished, in particular, by two advantages relative to known similarly encapsulated components. First, the planar surface of the frame provides a positive-fit contact with the component chip lying on the frame and also having a planar surface. There remains a minimal or even no gap between the frame and component chip and therefore a good closure of the cavity enclosed between the bottom side of the component chip and the surface of the carrier substrate within the frame is produced. This component can also be applied to an uneven and, e.g., non-linearly distorted panel as the carrier substrate.

In case of a later encapsulation of the chip lying on a planar surface with a polymer, this closure has the result that potential outgassing of $H_2O$, or decomposition products of the polymer from the polymer or solvents in the polymer is predominantly led to the outside and not into the cavity (hollow space). Thus, for an organic encapsulation, a JEDEC2 level is achieved.

In the sense of the invention, bumps are understood to be all electrically conductive structures and during bonding, "point-shaped" electrical contacts can be produced by means of these bumps. These can be, in detail:

- solder bumps, e.g., SAC (Sn Ag Cu) solder bumps that collapse during soldering to UBM (Under Bump Metallization),
- stud bumps that are pressed together by mechanical force with simultaneous ultrasound effect and fuse with the substrate. Stud bumps themselves can be produced with specially equipped wire bonders or galvanically. For stud bumps, Au studs are currently the standard,
- metal pillars that are equivalent to stud bumps, but also carry a solder reserve on their surface. Therefore, the selection of the usable metals is greater for such pillars. For example, pillars made from Cu can be used.

On the other hand, the height of the frame is adapted to the height of the bumps. This means that the bumps, for the case of bonding the component chip, and the solder bumps, for the case of subsequent reflow, collapse or can be deformed only to a certain extent and thus reduce their height so that the bottom side of the component chip comes to lie flat on the planar surface of the component chip. This has the result that, by means of the bumps and the support frame, only minimal mechanical tension forces act on the corresponding metallization on the component chip, because the thermal expansion coefficients of the bumps and solder frame are very well matched.

Tilting due, to uneven contact, is avoided by the planar surfaces of the support frame and component chip. This is especially advantageous when the component structures, and thus the component, are sensitive to mechanical loads, like those than can occur, for example, later during coating of the components with a plastic sheathing. With the proposed component, sensitive component structures can be enclosed without tension and sealed from environmental influences and can be encapsulated, also hermetically, by other measures.

The component chip can, advantageously be a MEMS component (micro-electro-mechanical system) that connects electrical and mechanical functions to each other. The micro-electro-mechanical functions can be those of sensors, actuators, switches, or electroacoustic components and can be, in particular, components operating with acoustic waves. These components are usually miniaturized, so that even very small forces are sufficient for disrupting the function or changing the properties of the MEMS component in an impermissible way. In principle, however, it is also possible to construct any electrical component that has component structures to be protected on its surface in the manner of the invention.

The carrier substrate has integrated electrical wiring. For this purpose, it advantageously has a multi-layer construction, wherein structured metallization layers that realize corresponding wiring are provided on, between, and under individual layers of a mechanically stable and electrically insulating material. The individual metallization layers are connected to each other by means of via contacts that are advantageously offset relative to each other, so that an electrical contact is produced for metallic connection surfaces formed on the surface of the carrier substrate and external contacts arranged on the bottom side of the carrier substrate. As a mechanically stable material, an especially highly filled plastic material with low water absorption, low gas permeability, and an adaptable thermal expansion coefficient (e.g., LCP (Liquid Crystal Polymer)) or a ceramic, such as, in particular, an HTCC (High Temperature Cofired Ceramic) or an LTCC (Low Temperature Cofired Ceramic) is suitable.

The connection metallization structures on the top side of the carrier substrate have a surface that can be soldered or bonded, in particular, a UBM metallization structure (Under Bump Metallization). Corresponding metallization structures are provided on the component chip. The bumps for connecting the component chip and the carrier substrate are advantageously solder bumps, stud bumps, or metal coated with solder, e.g., Cu pillars coated with solder.

Depending on the component, the component chip is formed from a ceramic, semiconductive, or other crystalline material, such as a piezoelectric crystal.

The support frame is advantageously produced on the carrier substrate and formed, in particular, from a plastic material or from metal. Advantageously, the coefficient of expansion of the material forming the support frame is adapted to that of the bumps. In this way it is guaranteed that the completed component generates no additional mechanical stress in the bump direction even under alternating thermal stress. The support frame can be applied to a ceramic carrier substrate by screen printing before sintering or also in another method after the sintering of the carrier substrate or else partially before sintering and the rest after sintering, e.g., by a currentless or galvanic process.

According to the type of component, the component structures can also be mechanically moving structures or, in the case of components operating with acoustic waves, metallization structures with which acoustic waves are produced, reflected, or converted back into electrical signals.

For further sealing of the component, the joint region between the bottom edge of the component chip and the support frame can be sealed with a film. This film is, in particular, a thermoplastic (e.g., LCP (Liquid Crystal Polymer) film) that can be laminated or a duroplastic in the B state, which is advantageously soft and features a low modulus of elasticity. Such a film can be used as a base for additional cover layers and therefore can absorb, buffer, or distribute forces (e.g., thermal cycles) acting on the component chip. In addition, it protects the cavity during subsequent processes, e.g., during the currentless or galvanic deposition of shieldings. The film can have one or more layers, wherein the same or different subfilms can be connected to each other or laminated one above the other.

In one advantageous configuration, the support frame is made essentially from a metal whose thermal expansion coefficient is adapted to the bumps, which are typically made from solder metal or to the metal of the stud bumps. For this purpose, copper, nickel, silver, or gold, which also can be deposited galvanically in an easily structured way are well suited. The support frame can also be assembled from several layers of different materials, in which case the thermal expansion coefficient averaged over all of the layers is well matched with that of the bumps.

In one configuration, the joint region between the bottom edge of the component chip and the support frame is sealed with a metal layer that forms a metal closure for the joint. Accordingly, the metal layer at least partially terminates the component chip and the support frame. The metal layer can be applied only in the joint region or alternatively also over larger parts of the component, that is, also on the reverse side of the component chip, the frame, or the surface of the carrier substrate.

It is advantageous to provide underneath the metal layer a metallic layer as a wetting layer that can, for treatment with a melted metal, wet the latter. Therefore it is possible to easily produce the metal closure and to simultaneously deposit the metal layer selectively over the wetting layer. This is advantageous if the metal layer is to be limited to the joint region, in order, for example, not to lead to interfering capacitive couplings with component electrodes on the reverse side of the component chip.

A component chip that is covered with a laminate film and that already has a certain sealing of the joint region can also be reinforced with a backside metallization structure. While the laminate film still has a certain permeability for gases and, in particular, water vapor, a hermetically sealed, electrically shielded component can be obtained with a closed backside metallization structure. It is advantageous if the backside metallization layer has a direct connection to a metallic support frame and/or to the surface of the carrier substrate. For this purpose, it can be necessary to structure the laminate film before generating the backside metallization layer and to remove it at least in a frame-shaped region drawn around the component.

The backside metallization structure can be deposited in two steps, by initially producing a thin base metallization structure in a thin-film method or by treatment with a nucleus-generating, e.g., palladium chloride-containing solution. Then this base metallization structure can be reinforced in a currentless and/or galvanic method. A well suited method is, for example, to sputter a titanium or a titanium/copper layer and to reinforce this galvanically with copper.

A direct structuring of the laminate film is possible, for example, by ablation with a laser. However, it is also possible to provide the laminate film photolithographically with a mask layer and to remove the laminate film in the regions to be detached with a solvent or in a dry-etching method, for example, with oxygen-containing plasma or else to use a laminate film that can be photostructured directly.

A support frame is sufficient as a spacer and for supporting the component chip by means of the carrier substrate for miniaturized components. For larger or mechanically especially sensitive and, e.g., especially thin component chips, a large distance between two contact points can lead to bending of the component chip and therefore also to a stress-induced negative effect on the component function. Therefore, it is advantageous to provide, between the component chip and carrier substrate, additional support elements that are structured together with the frame and that create additional contact points for the component chip with reduced distances between one another and that enable secure and low-stress contacting.

It is advantageous to support these additional support elements within the support frame at those positions on the component chip at which no component structures are provided. It is also possible, however, with the help of these additional support elements, to produce additional contact structures between contact surfaces on the component chip and connection surfaces on the carrier substrate. The contact pressure can be sufficient for producing the contact between the support element and the contact surface. It is advantageous, however, to bond or to solder the support element and the contact surface, for example, by means of a thermal compression method. Support elements made from, for example, Cu exhibit good bonding properties to Au or Cu/Au/Sn surfaces. To be able to solder the support element, these can be provided with a thin solder layer.

The same applies to the frame that can likewise be bonded with or without electrical contact to corresponding metallization structures on the component chip. This increases the stability of the component relative to mechanical loads and produces further miniaturization potential due to the reduction of the number of bumps, because the ground bumps are substituted by the frame.

On one component that is covered at least in the joint region or over the entire surface with a laminate film and/or a metal closure and/or a backside metallization structure, another glob top cover can be deposited for improving mechanical protection. For this purpose, a cover film that is sufficiently thick and that can be deformed to an adequate degree can be laminated on top, in order to allow planarization of the glob top surface. After lamination, the cover film has a total height above the carrier surface that is higher than the height of the back side of the component chip above the carrier substrate. The cover film or the glob top cover produced in this way can advantageously be selected with respect to its modulus of elasticity, its thermal expansion coefficient, and its glass-transition temperature in such a way that a minimum mechanical stress is produced during soldering of the component and during thermal cycles.

It is possible to further smooth the surface of the laminated cover film by means of a grinding or milling method or to set a defined total thickness.

Below, suitable methods for producing the component will be explained.

The starting point can be a carrier substrate with a large surface area, in particular, a panel or a carrier wafer that each have a plurality of mounting sites for component chips. Each mounting site has at least metallic connection surfaces for electrical contacting of the component chip. On this carrier wafer, the frame structures are initially produced in a number corresponding to the mounting sites and are structured advantageously in such a way that at least the metallic connection surfaces associated with one mounting site are enclosed by the support frame. Support elements can be produced together with the support frame.

If the support frame and support elements are produced galvanically by means of a common resist mask, then the subsequent planarization process of the support frame and support elements can be performed before the resist mask is removed again. Therefore, the support frame and support elements can be stabilized mechanically relative to the pressing, grinding, or milling methods that are used. The planarization process equalizes not only the difference in the frame height resulting from the tolerances in the production processes, but also those resulting from the topology of the carrier wafer.

In the next step, the bumps are produced on the component chip. This can be performed advantageously by means of printing a solder paste in a screen-printing method. With this method, the bump height can be easily adjusted, because it is essentially defined by the controllable size of the UBM and the quantity of deposited solder paste.

However, other methods for producing the bumps are also possible.

The bumps are preferably produced on the component chip BC. The already mentioned pillars that can be produced together with the frame structure in the same process and from the same material on the carrier substrate are an exception. In the production, the pillars, and optionally the frame structure as well, can already be provided with a solder layer with a thickness of typically, e.g., 5 μm that is thin relative to the height of the pillar.

Then the component chip is placed on the carrier substrate and connected to it in a suitable method by means of the bumps. If solder bumps are used, a reflow method is suitable. Here the solder bump collapses and changes its cross-sectional shape, wherein, in particular, its height is reduced. This has the result that the component chip is drawn downward by the adhesion forces on the wetting UBM. Because the height of the (collapsed) bump is adapted to the height of the support frame and the support element, this causes the component chip to rest against the support frame and the support elements. The pillars are also soldered. For the stud bumps, a thermal compression method can be used that also leads to a deformation of the bumps, wherein these are reduced in height.

In the next step, the component is sealed in the joint region between the component chip and support frame, wherein either a thin laminate film is laminated, a metal closure is produced, or a thick cover film is laminated directly for producing a glob top. The seal by means of a thin laminate film can be supplemented with a backside metallization structure and all of the sealing methods can also be combined with a deposited thick cover layer.

The preferred production of the metallic closure is performed with molten metal in the dipping method or in a standing wave. The quantity or the thickness of the metal here can be controlled by means of air or $N_2$ via gas nozzles (Hot Air Leveling). The required or advantageous wetting layer can be deposited in a structured form on corresponding surface regions of one or more elements selected from a component chip, carrier wafer, and support frame, or can be deposited over a large surface area after the bonding of the component chip on the arrangement. Here, individual regions of the surface can be excepted by a protective film from the coating with the wetting layer. The protective film can be printed selectively, e.g., with an inkjet method.

The outer component chip edges can be provided selectively with a wetting layer. This can be realized advantageously in the processing step in which the component chip is separated into single pieces. The separation can be performed with the so-called DBG method (Dicing Before Grinding) in which on the surface of the component wafer carrying the component structures, notches are initially produced along the designated separating lines. To protect the surface of the component wafer (e.g., from splitting), it is covered with a bonded tape used as a protective film. After the notches have been produced, the side edges of the individual component chips are exposed and in this way a metallization structure for producing a wetting layer, for example, a layer combination of titanium/copper/gold is accessible that can be sputtered, for example.

Then the component wafer is ground from the reverse side until the notches are completely opened from this side, by means of which the component chips are also separated into individual pieces. Alternatively, before removing the grinding tape of the front side (for protecting the component structures) the component chip edges can be selectively provided with a wetting layer, in that by means of charges produced pyroelectrically only on the reverse side, the deposition of the wetting layer in an activation or metallization bath that is sensitive to the charge state of the surface is avoided.

The advantage of this method by means of charges produced pyroelectrically is that it can also be applied to bumped chips that point face down in the adhesive bed of a mounting film after the DBG process (Dicing before Grinding) and thus are sealed from wet-chemical processes. For wafers that are only cut, the process mentioned above also works when the wafers are remounted after the cutting.

Wetting layers on the surfaces of the carrier wafer and component chip can be deposited directly, for example, by means of thin-film methods over corresponding masks or directly by means of screen printing.

BRIEF DESCRIPTION OF THE DRAWINGS

Below, the invention will be explained in more detail with reference to embodiments and the associated figures. The figures are used only for illustrating the invention and are therefore drawn only schematically and not true to scale.

FIG. 1, which includes

FIG. 5, which includes FIGS. 5A-5D, shows, in schematic cross section, different relative arrangements of component chip edges and frame structures;

FIG. 9, which includes FIGS. 9A-9F, shows different possibilities of a metal closure;

The following list of reference symbols can be used in conjunction with the drawings:

TS Carrier substrate
TW Carrier wafer
EP Mounting sites
AFL Metallic connection surfaces
TL Separating lines between mounting sites
SR Support frame
GR Galvanic resist
WS Growth layer
VS Reinforcement layer for WS
SE Support elements
BC Component chip
BS Component structures
AK Outer contacts
BU Bumps
LF Laminate film
RM Backside metallization structure
DS Thin film
AF Cover film
BS Wetting layer
MV Metal closure
RS Frame structure

DETAILED DESCRIPTION OF ILLUSTRATIVE EMBODIMENTS

FIG. 1 shows, in schematic cross section, different processing steps for producing the support frame SR and additional support elements SE on a carrier substrate. The starting point is a carrier wafer or panel, below called only carrier wafer TW, that advantageously has a multi-layer construction and in which wiring is integrated. (Not shown in the figure.) Also not shown are connection surfaces on the top side and external contacts on the bottom side of the carrier wafer TW.

Figure 1A:
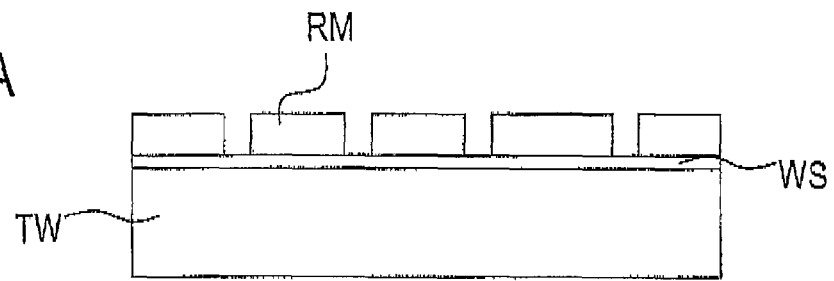
FIGS. 1A-1D, shows, with reference to schematic cross sections, the production of the support frame and support structures on a carrier wafer.

In the first step, the carrier wafer TW that carries UBM structures and that is deformed linearly and non-linearly if it is made from HTCC or LTCC is dimensioned with high accuracy with respect to the UBM positions. Then, a metallic growth layer WS is deposited on the surface, for example, in a currentless method or in a PVD method. Above this growth layer WS, a galvanostable resist is deposited and structured according to the desired structure of the support frame SR and the support element SE, e.g., by means of laser lithography. Non-deformed carrier wafers TW can also be exposed by means of a mask. FIG. 1A shows the arrangement after the structuring of the galvanic resist.

Figure 1B:
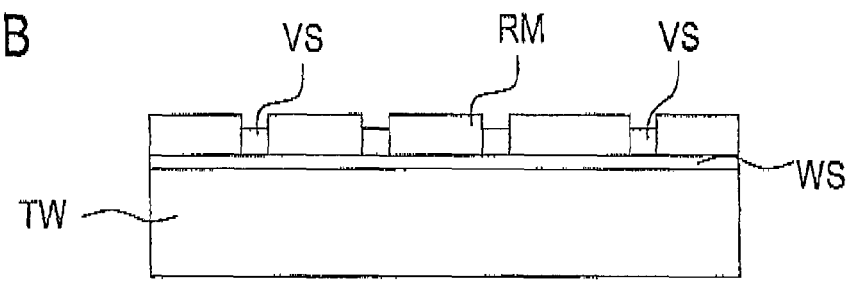

Then, in the recesses of the galvanic resist in which the growth layer WS is exposed, the reinforcing layer VS is produced, for example, by deposition of copper (see FIG. 1B).

Figure 1C:
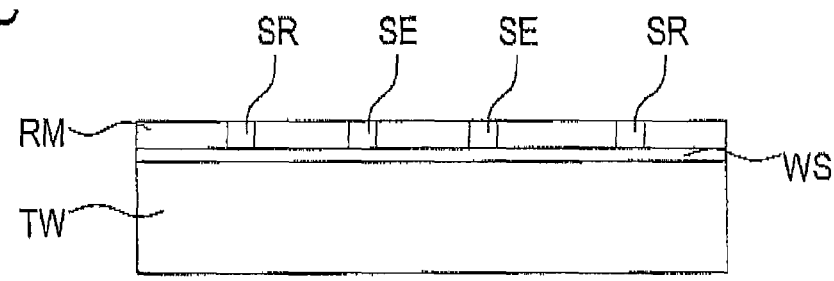
Figure 1D:
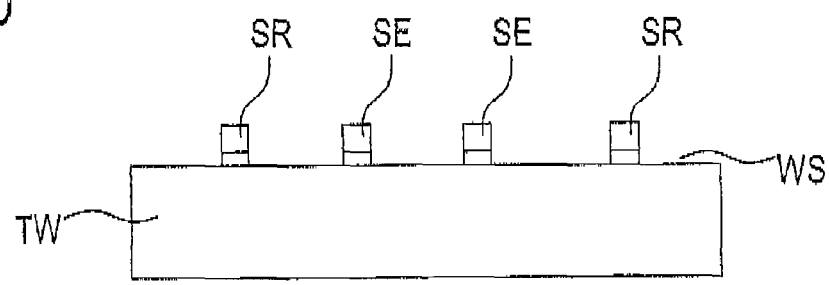

FIG. 1C shows the arrangement after performing a planarization process in which the surfaces of the galvanic resist GR and the reinforcing layer VS are removed until an overall planar surface is produced. Then the galvanic resist GR is removed and the underlying residue of the growth layer WS is etched. FIG. 1D shows the arrangement with the support frame SR and support elements SE produced in this way.

Figure 2:
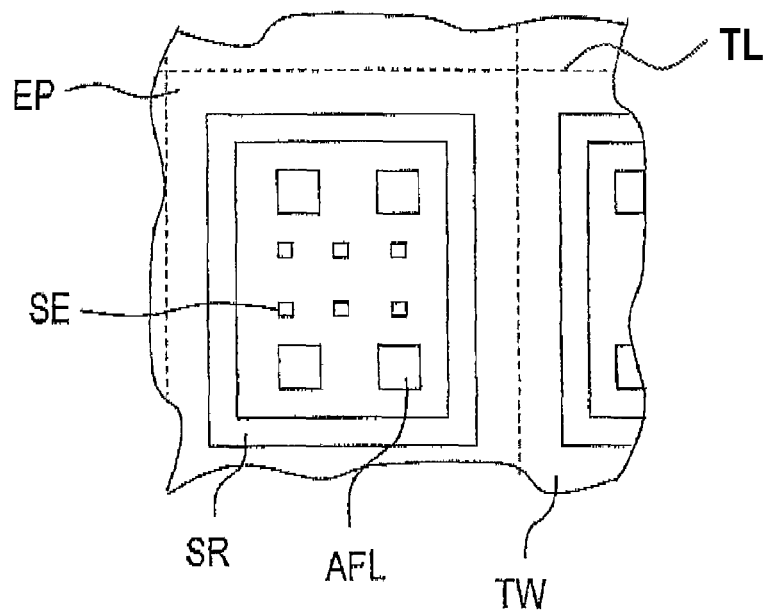
FIG. 2 shows a carrier wafer with support structures deposited on this wafer in top view.

FIG. 2 shows, in top view, a possible arrangement of the support frame SR and support elements SE on a carrier wafer TW. Between different mounting sites EP for individual components, the separating lines TL are indicated by dashed lines. Each support frame SR encloses metallic connection surfaces AFL for the later component contacting and also support elements SE optionally structured together with the support frame SR. The two-dimensional shape of the support frame SR in the diagram advantageously follows the dimensions of the component chip to be deposited on this frame and is dimensioned at least so that the component chip can form an all-around contact, wherein the component chip edge can form a flush seal with the outer edge of the support frame SR or wherein either the component chip or support frame SR can project past the outer edge.

A metallic support frame SR and support element SE produced in parallel can also be manufactured by depositing a metal-containing mass in an inkjet method.

The bumps BU can be produced as metal pillars together with the support frame SR or with the support elements SE on the carrier wafer TW. However, they can also be produced, as described above, on the opposite component chip BC on the wafer base in the case of solder bumps or stud bumps. This can be realized, in particular, by printing a solder paste. For a small number of bumps, the use of stud bumps can also be advantageous or economical.

Figure 3:
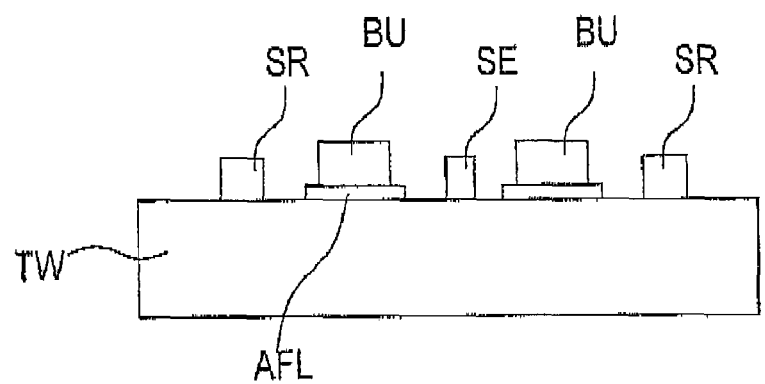
FIG. 3 shows a carrier wafer in schematic cross section after the application of bumps.
Figure 4:
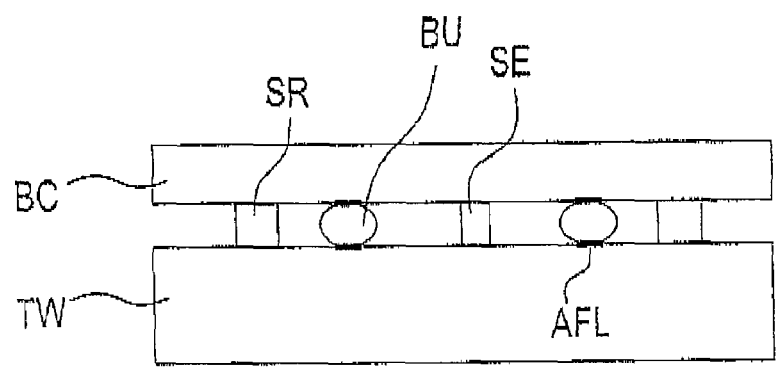
FIG. 4 shows the carrier wafer after bonding of a component chip.

FIG. 3 shows the arrangement with bump precursors printed here on the carrier wafer TW. They project in height past the support frame and the optionally present support elements SE, so that a component chip BC can be placed and soldered on top. FIG. 4 shows the placed component chip after soldering.

The solder is either on the Cu pillar of the carrier wafer TW or else on the SAC bumps of the component chip BC. In the thermosonic method, stud bumps made from Au are connected without solder. In the case of SAC bumps, the bumps collapse during soldering through wetting of the UBM surfaces on the carrier wafer TW, wherein the component chip BC is placed on the support frame SR and the support elements SE.

The volume and the height of the bumps BU are also dimensioned during their production on the component chip BC so that for the collapse or the deformation of the bumps BU, without the support frame SR and support elements SE acting as spacers, a corresponding height would also be set that is equal to or lies only slightly below that of the support elements SE. This guarantees that the connection produced by the bumps is largely free from tensile forces that could act in the form of warping of the component chip BC and thus negatively affect the component functions. For non-collapsing bumps, the component chip BC can sit on the support frame SR before the bonding.

In a schematic cross section, FIG. 5 shows different possibilities for how the component chip BC can lie on the support frame SR. According to FIG. 5A, the edge of the component chip BC can lie in the center on the support frame SR. As a tolerance value both for the positioning of the support frame SR and also the positioning of the component chip BC on the support frame SR, nearly the entire width of the support frame SR remains.

FIG. 5B shows a variant in which the support frame SR reaches up to the separating line TL that represents the later component edge. This construction requires a separation of the components by means of a cut guided by the support frame SR, wherein a peripheral strip of the metallic surface is simultaneously produced at the cutting edges of the support frame SR.

FIG. 5C shows a component chip BC whose edge projects past the support frame SR. FIG. 5D shows a limiting case in which the outer edge of the support frame SR and the outer edge of the component chip BC terminate flush. This, however, is an ideal case that is neither aimed for nor maintained in practice due to tolerances to be maintained. As a rule, such an arrangement is selected that results in a minimum component volume or minimum component surface. Constructions according to FIGS. 5A and 5B are preferred when only little contact surface is available on the bottom side of the component chip BC that is free from component structures. Constructions according to FIGS. 5C and 5D are optimized with respect to the base surface of the mounting sites.

Figure 6:
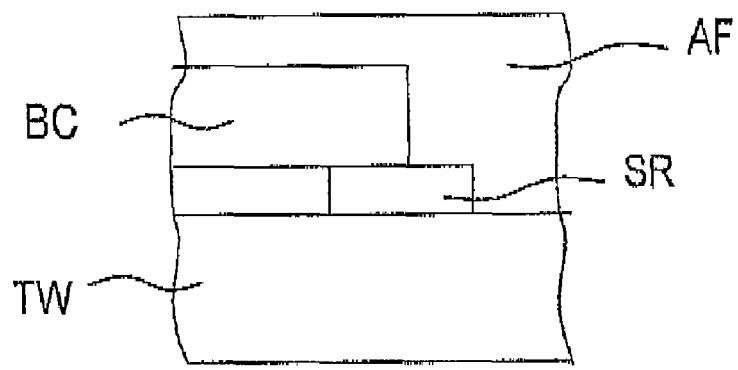
FIG. 6 shows a component sealed with a cover film.

FIG. 6 shows a possibility for sealing the component in the joint region between the component chip BC and support frame SR. As shown in FIG. 6, this can be realized by applying a cover film AF. This is relatively thick and comprises a polymer in the B state, so that it can deform thermally and then harden. During the lamination, the cover film AF is deposited, for example, by heating and pressure, onto the surface so that it closely follows the topography without leaving cavities during the lamination between the cover film AF and carrier wafer TW or frame structure SR and component chip BC. Simultaneously, a planarized surface is maintained. Due to the overall height of the laminated cover film above the component chip BC, it is guaranteed that the component chip BC is also covered by the cover film AF, like its joint region to the frame structure.

Figure 7:
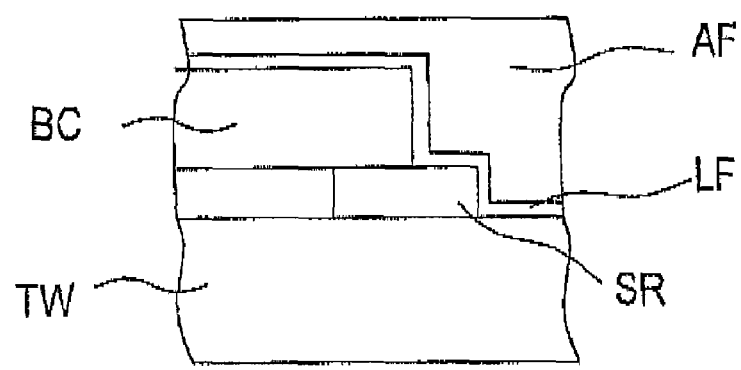
FIG. 7 shows a component sealed with a laminate film and a cover film.

In one variant of this method, a laminate film LF that is made, in particular, from a soft thermoplastic material, can be deposited under the cover film AF. Such a thin film can be laminated more easily and with lower contact pressure than the relatively thick cover film AF. Its low modulus of elasticity also has the result that the component chip BC itself is optimally protected against forces that could act on the component chip BC during the soldering of this chip, during thermal cycles, or first in the second level in the remolded module (provided with a molding encapsulation), because it represents to a certain extent a buffer and can also better absorb and distribute incoming forces. The laminate film LF and cover film AF can be laminated in separate steps or in the same step. FIG. 7 shows, in sections, a component sealed in this way in schematic cross section.

FIG. 8 shows another possibility for sealing in which, in the first step, a laminate film LF is deposited similar to the construction according to FIG. 7. After deposition, the laminate film LF can be structured, wherein at least the joint region between the frame structure and component chip BC remains covered by the laminate film LF. Due to the structuring, underlying solid material, in particular, the frame structure and/or a part of the surface of the carrier wafer TW can be exposed in the region of a peripheral sealing edge. In the next step, above the laminate film LF a backside metallization structure RM is produced, for example, similarly as shown in FIG. 1 for the support frame SR, in a two-step method by means of a base metallization structure that is deposited in a thin-film method and that can then be reinforced galvanically. The base layer can contain, for example, titanium. The galvanic reinforcement can include copper.

Figure 8A:
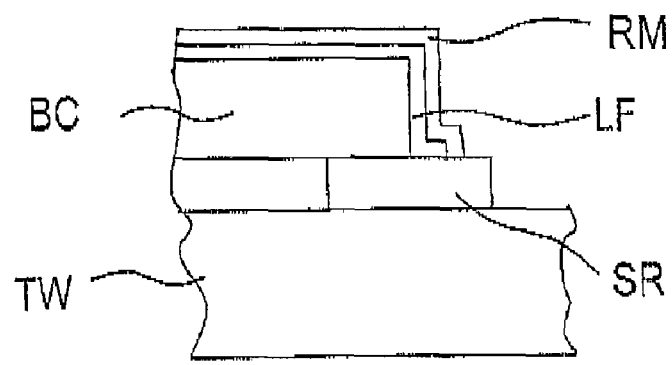
FIGS. 8A and 8B show two different possibilities for hermetic sealing of a component with a laminate film and a backside metallization structure.
Figure 8B:
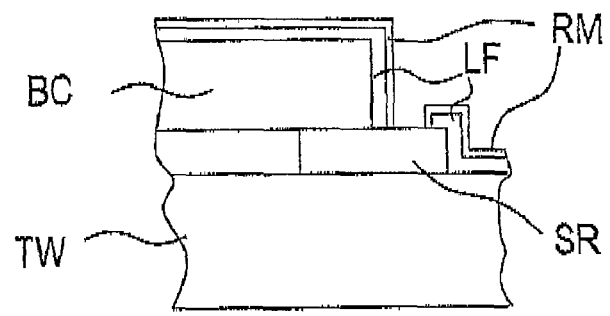

FIG. 8A shows a construction of the structuring of laminate film LF and backside metallization layer RM in which both the edges of the laminate film LF and also the backside metallization structure RM both terminate on the surface of the support frame SR. FIG. 8B shows a variant in which the laminate film is removed in a frame-shaped sealing region above the now exposed surface of the support frame, so that the support frame can be contacted by the backside metallization structure RM.

In all cases, an especially tight connection, in particular relative to wet diffusion, is produced by means of the metal-metal connection between the backside metallization structure RM and support frame SR. By means of the backside metallization structure RM placed without tension, the mechanical stability of the entire component is increased. This is advantageous when the component is later encased with a plastic mass in a so-called transfer-mold process for additional packaging and encapsulation. In addition, the backside metallization structure RM is used for electromagnetic shielding of the component.

Figure 9A:
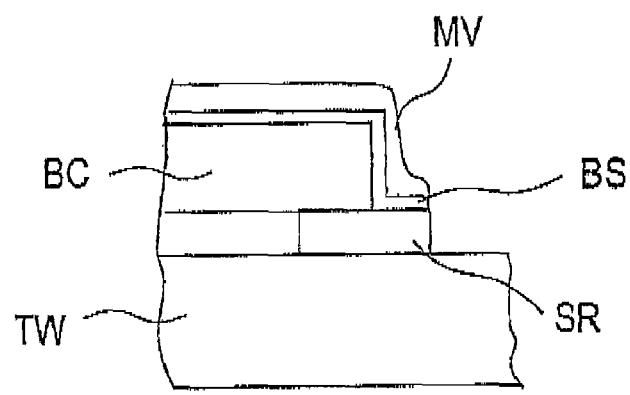

FIG. 9 shows different possibilities for how the joint region can be closed with a metallic closure MV. For this purpose, a suitable wetting layer BS is arranged at least in the joint region between support frames SR and in the region of the component chip edge. This can be deposited after the soldering of the component chip BC and, for example, sputtered or vacuum evaporated. It is further possible to deposit the wetting layer BS before placement of the component chip BC both on the component chip itself and also on the surface of the support frame SR. A wetting layer BS can also be provided on the surface of the carrier wafer TW. FIG. 9A shows a possible formation of the metal closure MV in schematic cross section. A wetting layer BS is provided at least on parts of the surface of the component chip BC, on its edge, and also on the surface of the support frame SR. On this wetting layer BS, molten metal is deposited and allowed to cool, wherein the metal closure MV bonds on the component at the positions at which the wetting layer BS is present. The construction shown in FIG. 9A does not exclude that the wetting layer BS contacts a large surface on the component chip BC and also on the carrier wafer TW. It is also possible for the support frame SR to be completely covered by a wetting layer BS.

Figure 9B:
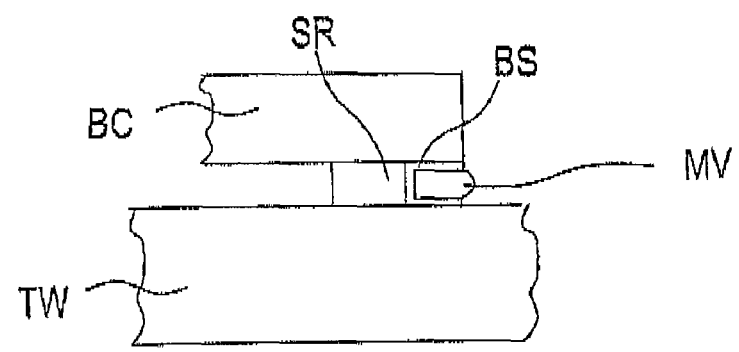

FIG. 9B shows an arrangement in which the component chip edge projects past the support frame SR. The wetting layer BS is therefore required only on the bottom side of the projecting component chip, on the outside of the support frame SR, and also on a surface region of the carrier wafer TW underneath the projecting component chip edge. In this construction it is advantageous to generate the wetting layer BS before the soldering of the component chip BC optionally structured both on the carrier wafer TW and also on the bottom side of the component chip BC.

Figure 9C:
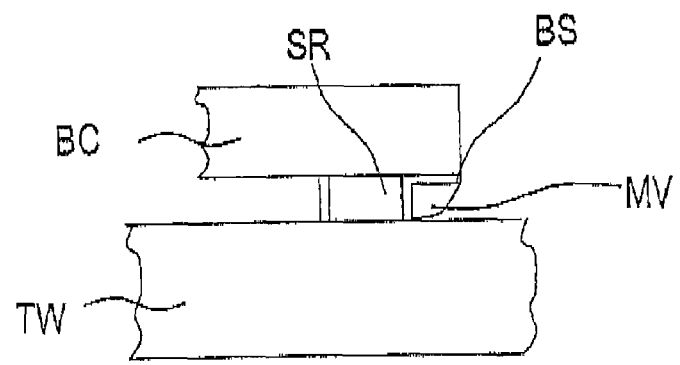

FIG. 9C shows a similar construction in which the wetting layer BS is deposited, however, only on the bottom side of the component chip BC in the projection region and also on the (total) surface of the support frame SR. With this minimized embodiment, the joint region is also sealed optimally.

FIG. 9D shows a construction in which the edge of the component chip BC terminates flush or nearly flush with the outer edge of the support frame SR. Both outer edges are therefore provided with a wetting layer BS on which the metal closure is then deposited with one of the mentioned methods.

For sealing with a metal closure MV, the molten metal to be applied can be selected so that it has a lower melting point than the bump connection. In this way, for production of the metal closure, melting of the bump is prevented. Through corresponding selection of the wetting layer BS on the frame SR, component chip BC, and/or carrier wafer TW, a higher melting alloy that is not fluid for later soldering of the component can be obtained through remelting with the metal closure. For this purpose, for example, a metal closure is suitable that includes tin that forms a corresponding alloy in contact with the Ti/Cu/Au wetting layer. In addition, all of the embodiments of the metal closure MV shown, for example, in FIG. 9 can be covered by an additional nickel layer deposited above the metal closure MV. This also prevents a partial melting of the metal closure MV during soldering and further stabilizes the component in a mechanical way. This nickel layer also has the advantage that it is suitable in a simple way as a contrast layer for a laser marking process.

FIG. 9E shows another processing variant in which the bump height is dimensioned so that during soldering a small gap remains between the component chip BC and frame structure SR. In the region of the frame structure, a peripheral, frame-shaped wetting layer is deposited on the bottom side of the component chip BC. Another wetting layer BS is located on the surface of the frame structure SR and is deposited, for example, after its planarization, e.g., in a currentless method as a Au layer that is typically 0.1 μm thick. The gap remaining after the soldering of the component chip BC can be filled with the metal closure MV. The capillary depression in the gap prevents penetration of the fluid metal into the cavity under the component chip.

FIG. 9F shows another processing variant in which, in addition to the support frame SR on the carrier wafer TW, a peripheral frame structure RS is also deposited on the component chip BC. This can be structured essentially finer than the support frame SR and can have, e.g., a width and height each typically 5 μm. It can be made from the same material and can be wetted at least partially with solder. The support frame SR on the carrier wafer TW has a typical height and width of 50 μm. Both frames can be soldered to each other. The joint during bonding is then produced between the support frame SR and frame structure RS and is provided with a metal closure MV. An advantage of this arrangement is that, due to the lower width of the frame structure RS on the component chip BC, a greater usable chip surface remains than when the relatively wide support frame was set on the component chip BC.

Figure 10:
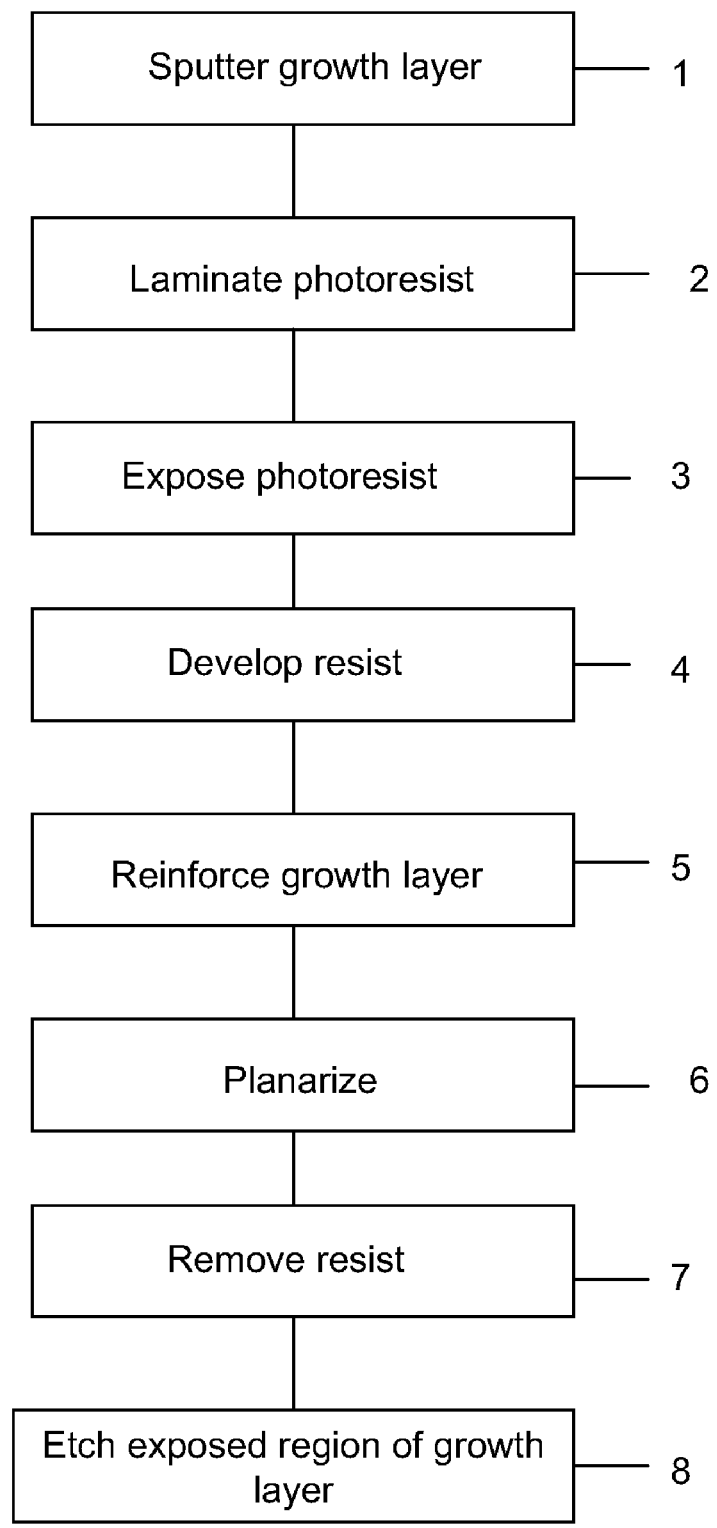
FIG. 10 shows a process flow diagram for the production of a support frame.

FIG. 10 shows a process flow diagram for the production of a frame structure SR on a carrier wafer TW as was explained with reference to FIG. 1. In step 1, a growth layer is sputtered onto the entire surface of the carrier wafer. In step 2, a photoresist is laminated. In step 3, the photoresist is exposed. For the use of a positive photoresist, the surface regions of the laminated photoresist are exposed on which a later metallization structure (support frame and support elements) are to be produced. In step 4, the resist is developed, wherein the desired resist structure is produced. In the next step, the growth layer is reinforced through galvanic deposition of copper up to a desired layer thickness. In step 6, the grown metal layer together with the galvanic resist mask projecting above this metal layer is planarized with the help of a milling method. For this purpose, for example, the so-called fly cutting method can be used in which a diamond rotates above the surface to be ground. The grinding is performed up to a given height of the frame structure SR. In this state, the carrier wafer TW or the support frame SR can be provided in a currentless method with a wetting layer BS of typically 0.1 μm Au. This measure also prevents, e.g., that in the step 8, etching of the growth layer, the surface of the planarized reinforcement layer is etched.

In the next step 7, the resist is removed and the remaining, now exposed region of the growth layer is etched in step 8. Then the carrier wafer TW provided with the support frame SR and support elements SE is completed for the performance of the flip chip process.

Figure 11:
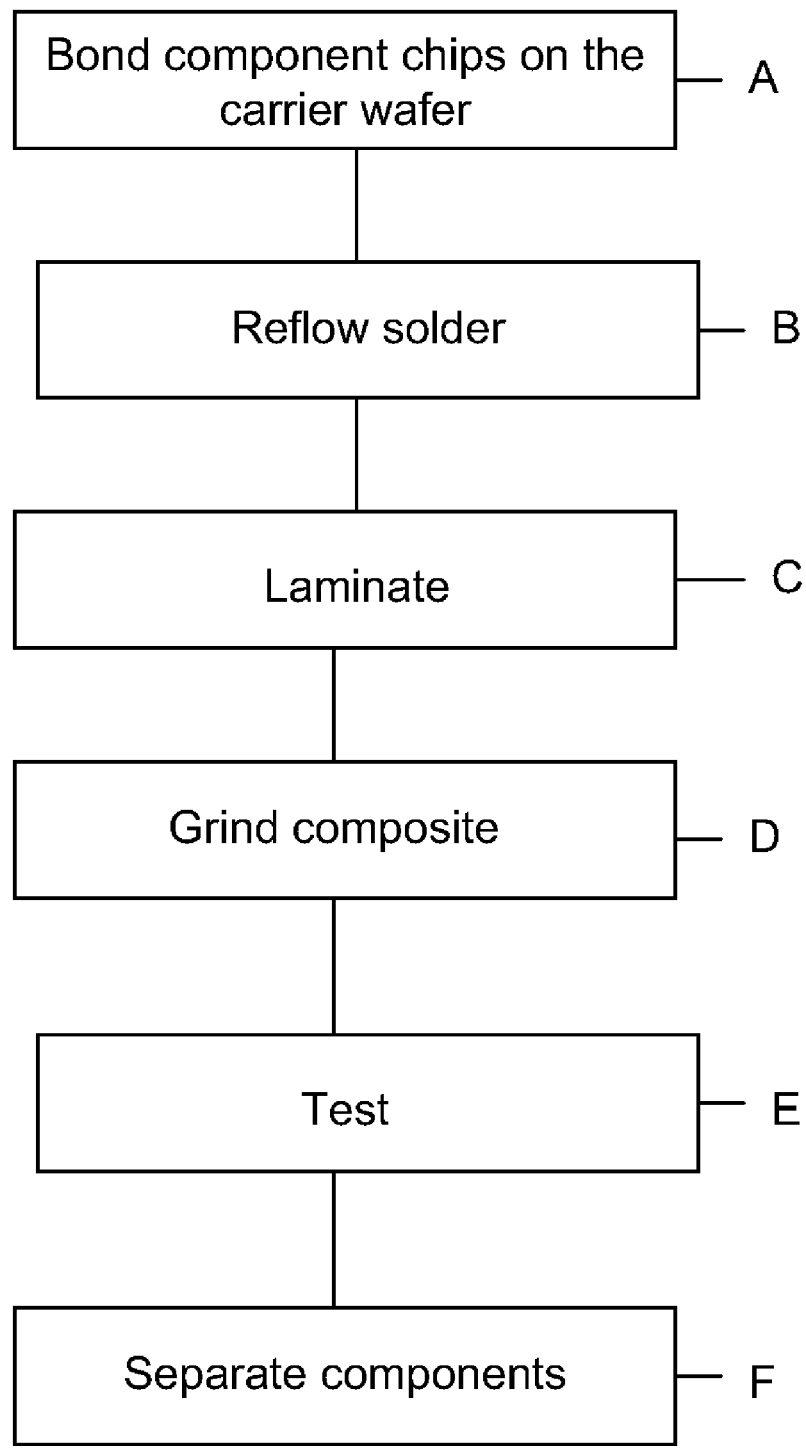
FIG. 11 shows a process flow diagram for the deposition of a laminate.

FIG. 11 shows a flow chart for a sealing by means of lamination. In a step A, the component chips BC are bonded on the carrier wafer TW at the corresponding mounting sites. In step B a reflow solder process is performed. Following this is a lamination process in processing step C. Here, two films are placed one above the other and laminated over the entire surface on the back sides of the bonded component chips. The lower layer is relatively thin, thermoplastic, and soft, while the upper layer is a curable layer that is relatively highly filled with a filler. In this lamination process, it is also possible to laminate a third film lying in-between that is also relatively soft but harder than the laminate film. In step D, the composite made from the carrier wafer TW, component chips BC, and laminate film LF is subjected to a grinding process from the top side, in order to achieve a minimum overall height. Then the components are separated into individual pieces in step F, for example, by means of a cutting process. In addition to this basic processing sequence, other optional steps can also be added. For example, between steps B and C, a cleaning process can be performed by means of an oxygen molecule and hydrogen molecule containing plasma. Between steps D and F, the component can be tested and optionally marked.

Figure 12:
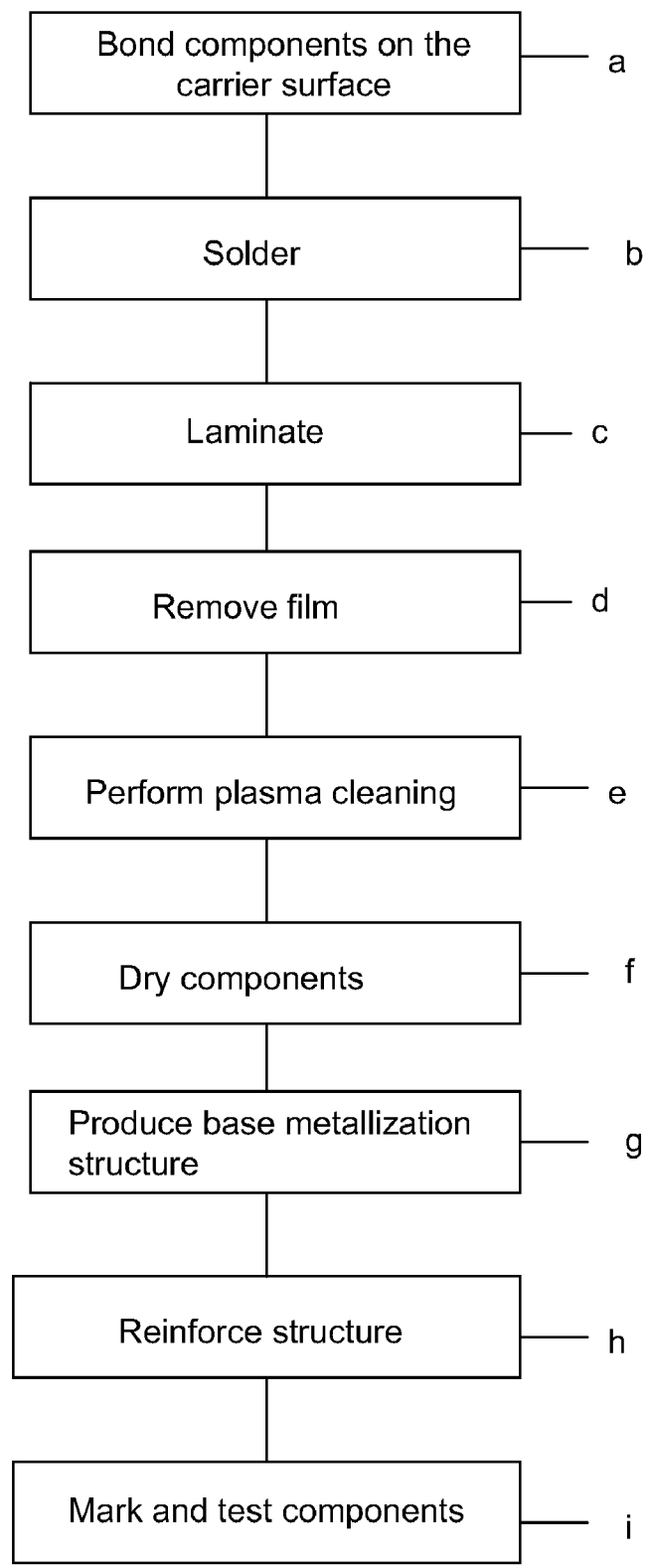
FIG. 12 shows a process flow diagram for the production of a seal by means of a laminate film and backside metallization structure.

FIG. 12 shows a process flow diagram for the production of a backside metallization structure RM. Initially, the components are bonded in a flip-chip process a) on the carrier surface and then soldered by means of a reflow solder process in step b). Following this is a lamination process c) in which a thin, soft laminate film is laminated over the entire surface of the component chips BC and carrier wafer TW. Then, in step d) the film is removed again, for example, by means of laser ablation or by means of cutting at least in a frame-shaped partial region.

Following this is, in step e), a plasma cleaning step in an oxygen and/or hydrogen containing plasma. In step f) that is to be performed optionally, the components are dried in vacuum. Then in step g) the production of a base metallization structure is performed through sputtering of a titanium/copper mixture that is then reinforced in step h) through galvanic deposition of copper and then nickel. The components realized on the carrier wafer TW are now completed and can be fed optionally under execution of laser marking and electrical testing of the component properties in step i) to the separation process by means of cutting.

In particular, the method according to FIG. 6, but also the other described closure methods, can be used to produce components from "bare dies" directly on modules. For this purpose, known good dies, that is, dies that have been dimensioned and found to be good, are bonded directly on module substrates that have corresponding frames, spacing, and optional pillar structures and are remolded according to FIG. 6 together with components deposited in SMD or wire-bonding technology or in the embedding method on the modules or laminated over with a glob top of similar compounds. In all cases, components or modules are obtained that are minimized with respect to their outer dimensions that are sealed tight from environmental influences and, in particular from moisture, and that can be produced more easily than before in the method according to the invention. For the same or smaller dimensions, the components have improved mechanical stability and show improved moldability and increased thermal cycle resistance.

The invention is also not limited to the embodiment examples shown in the embodiments and the figures but instead is defined just by the claims. Therefore, it lies in the scope of the invention to further combine the individual possibilities for sealing with each other or to vary the sealing method. The components can be realized for each component type with an arbitrary number of support frames with and without additional support elements. It is also possible to mount different component chips on one carrier wafer and to separate into equal components containing different component chips or into different components.

What is claimed is:

1. A method for producing a component, the method comprising:
   providing a carrier substrate that has a plurality of mounting sites for component chips, wherein a metallic connection surface is provided at each mounting site for electrical contacting of a component chip;
   forming frame structures that enclose each mounting site;
   planarizing the frame structures by a mechanical method;
   forming bumps on the connection surfaces or on the component chips;
   bonding the component chips in a flip-chip arrangement using the bumps, wherein the bumps collapse or deform so that each component chip comes to lie on a corresponding support frame, wherein the frame structures are planarized so that a height of the support frame after the planarization corresponds to a height of the deformed or collapsed bumps after the bonding; and
   covering a joint region between a bottom edge of the component chip and the support frame with a sealing material.

2. The method according to claim 1, wherein forming the frame structures comprises providing a forming mask of galvanic resist so that the support frame is produced lithographically on the carrier substrate, wherein a metallic growth layer deposited on an entire surface of the carrier substrate is reinforced galvanically.

3. The method according to claim 1, wherein covering the joint region comprises laminating a laminate film comprising a thermoplastic over the entire arrangement as the sealing material so that the sealing material lies on backsides of the component chips and on the support frames.

4. The method according to claim 3, further comprising removing the laminate film after lamination for each component chip in a frame-shaped region and wherein a surface of the support frame is exposed, and then depositing a metal layer over the entire surface.

5. The method according to claim 1, further comprising forming a wetting layer in the joint region at least at an edge of the component chip and at the support frame and bringing a molten metal into contact with the wetting layer so that a metal layer sealing the joint region is formed there.

6. The method according to claim 5, wherein forming the wetting layer comprises depositing a layer sequence of Ti/Cu/Au.

7. The method according to claim 5, wherein the molten metal is deposited in a dipping method or is deposited in a standing wave.

8. The method according to claim 5, wherein the metal is deposited in a plasma spraying method.

9. The method according to claim 5, wherein a back side of the component chip is protected from a coating with the molten metal with the help of a plastic layer deposited on the back side.

10. The method according to claim 5, wherein the molten metal and the wetting layer form an alloy with a melting point greater than a melting point of the molten metal.

11. The method according to claim 1, further comprising laminating a cover film over the component, wherein a total height of the cover film above the carrier substrate is set higher than a height of a back side of the component chip, wherein a surface of the laminated cover film is planarized.

12. The method according to claim 11, wherein laminating the cover film comprises using a thermally deformable cover film made from a plastic material in the B state that is hardened thermally after lamination or using a cover film made from a thermoplastic material.

13. The method according to claim 1, further comprising forming support elements in a common process together with the support frame, the support elements lying within the support frame and having the same height as the support frame, wherein the support elements are arranged so that the component chip comes to lie on the support elements with regions of its surface that are free of component structures.

14. The method according to claim 1, further comprising forming support elements in a common process together with the support frame, the support elements lying within the support frame and having a same height, wherein with a part of the support elements after the bonding of the component chips, an electrical connection between the component chips and the metallic connection surface is produced on the carrier substrate.

15. A method of producing an electrical component, the method comprising:
   providing a single-layer or multi-layer carrier substrate that has electrical wiring;
   arranging a support frame between the carrier substrate and a component chip;
   mounting the component chip on the carrier substrate in flip-chip technology by means of bumps, the component chip being electrically connected to the electrical wiring and having component structures on its surface pointing toward the carrier substrate, wherein the support frame is adapted in its height to the bumps, has a planar or planarized surface, and contacts closely to a bottom side of the component chip, wherein the support frame is essentially made from metal; and
   sealing a joint region with a film, the joint region between a bottom edge of the component chip and the support frame.

16. The method according to claim 15, wherein sealing the joint region comprises sealing the joint region with a metal layer.

17. The method according to claim 16, wherein the metal layer terminates with metal of the support frame.

18. The method according to claim 17, wherein the metal layer terminates with the component chip.

19. The method according to claim 15, further comprising covering a back side of the component chip opposite the component structures with a laminate film terminating with the support frame.

20. The method according to claim 19, further comprising forming a metal layer over the laminate film.

21. The method according to claim 20, further comprising forming a plastic cover whose surface is planarized over the laminate film.

22. The method according to claim 15, further comprising forming support elements that match the support frame in height and material within the support frame between the component chip and carrier substrate.

* * * * *